United States Patent [19]
Uchida

[11] Patent Number: 5,394,404
[45] Date of Patent: Feb. 28, 1995

[54] FLIP-FLOP CIRCUIT HAVING DIAGNOSTIC FUNCTION

[75] Inventor: Wataru Uchida, Hyogo, Japan

[73] Assignee: Mitsubishi Denki Kabushiki Kaisha, Tokyo, Japan

[21] Appl. No.: 968,884

[22] Filed: Oct. 30, 1992

[30] Foreign Application Priority Data

May 19, 1992 [JP] Japan .................................. 4-125963

[51] Int. Cl.$^6$ .......................................... G01K 31/29
[52] U.S. Cl. ................................. 371/22.5; 324/73.1; 365/154
[58] Field of Search ............... 365/154, 156; 324/73.1; 371/1, 15.1, 16.1, 16.2, 18, 22.1, 22.5, 24, 27; 307/406, 289, 415

[56] References Cited

U.S. PATENT DOCUMENTS

| | | | |
|---|---|---|---|
| 4,855,669 | 8/1989 | Mahoney | 324/73.1 |
| 4,862,068 | 8/1989 | Kawashima et al. | 324/73.1 |
| 4,975,595 | 12/1990 | Roberts et al. | 307/289 |
| 5,109,190 | 4/1992 | Sakashi et al. | 324/73.1 |
| 5,155,383 | 10/1992 | Barbera | 307/289 |

FOREIGN PATENT DOCUMENTS

| | | |
|---|---|---|
| 61-62878 | 3/1986 | Japan . |
| 62-143513 | 6/1987 | Japan . |
| 1-208012 | 8/1989 | Japan . |
| 1-265608 | 10/1989 | Japan . |
| 4-40113 | 2/1992 | Japan . |

OTHER PUBLICATIONS

"Test Generation Systems in Japan", by S. Funatsu et al., Proc. 12th Design Automation Conf., pp. 114–122 (1975).

*Primary Examiner*—Emanuel T. Voeltz
*Assistant Examiner*—Craig Miller
*Attorney, Agent, or Firm*—Lowe, Price, LeBlanc & Becker

[57] ABSTRACT

A flip-flop circuit further includes a diagnosis clock input terminal, a set/reset system control signal input terminal, a first phase shift operation clock input terminal and a second phase shift operation clock input terminal. The flip-flop circuit can be set to a normal operation state, a diagnostic operation state, or a shift operation state by fixing potentials of these input terminals.

16 Claims, 9 Drawing Sheets

| | A | B | C | X | T | D1 | T1 | S1 | R1 | T2 | S2 | R2 |
|---|---|---|---|---|---|---|---|---|---|---|---|---|
| IN NORMAL OPERATION | L | H | H | H | ⎍CLK | MD | ⎎/CLK | ST | RST | ⎍CLK | ST | RST |
| IN DIAGNOSTIC OPERATION — MAIN COMBINATION CIRCUIT | L | L | ⎍TCLK | L | L | MD | ⎍TCLK | H | H | L | H | H |
| | | | | | H | - | L | | | | | |
| IN DIAGNOSTIC OPERATION — SET/RESET SYSTEM | L | L | L | ⎍S/R | - | - | L | ⎎ST | ⎎RST | L | H | H |
| IN SHIFT OPERATION | ⎍SCLK1 | ⎍SCLK2 | L | L | - | TD | ⎍SCLK1 | H | H | ⎍SCLK2 | H | H |

|  | A | B | C | T | D1 | T1 | S1 | R1 | T2 | S2 | R2 |
|---|---|---|---|---|---|---|---|---|---|---|---|
| IN NORMAL OPERATION | L | H | H | ⊓CLK | MD | ⊔/CLK | ST | RST | ⊓CLK | ST | RST |
| IN DIAGNOSTIC OPERATION | L | L | ⊓TCLK | L / H | MD / – | ⊓TCLK / L | ⊔ST | ⊔RST | L | H | H |
| IN SHIFT OPERATION | ⊓SCLK1 | ⊓SCLK2 | L | – | TD | ⊓SCLK1 | H | H | ⊓SCLK2 | H | H |

|  | A | T | T1 | T2 | D1 |
|---|---|---|---|---|---|
| IN NORMAL OPERATION | L | ⊓ CLK | ⊓ CLK | ⊔ /CLK | MD |
| IN SHIFT OPERATION | ⊓ SCLK1 | L | ⊓ SCLK1 | ⊔ /SCLK1 | TD | ic
FLIP-FLOP CIRCUIT HAVING DIAGNOSTIC FUNCTION

BACKGROUND OF THE INVENTION

1. Field of the Invention

The present invention relates to flip-flop circuits, and particularly to flip-flop circuits having a function of diagnosing (testing) a combination circuit.

2. Description of the Background Art

With the higher integration of logic circuits, a diagnosis (test) thereof has become more difficult. In order to diagnose a logic circuit readily, a flip-flop circuit has been developed which serves as a flip-flop in normal operation, and as a shift register in diagnostic operation.

Figure 7:
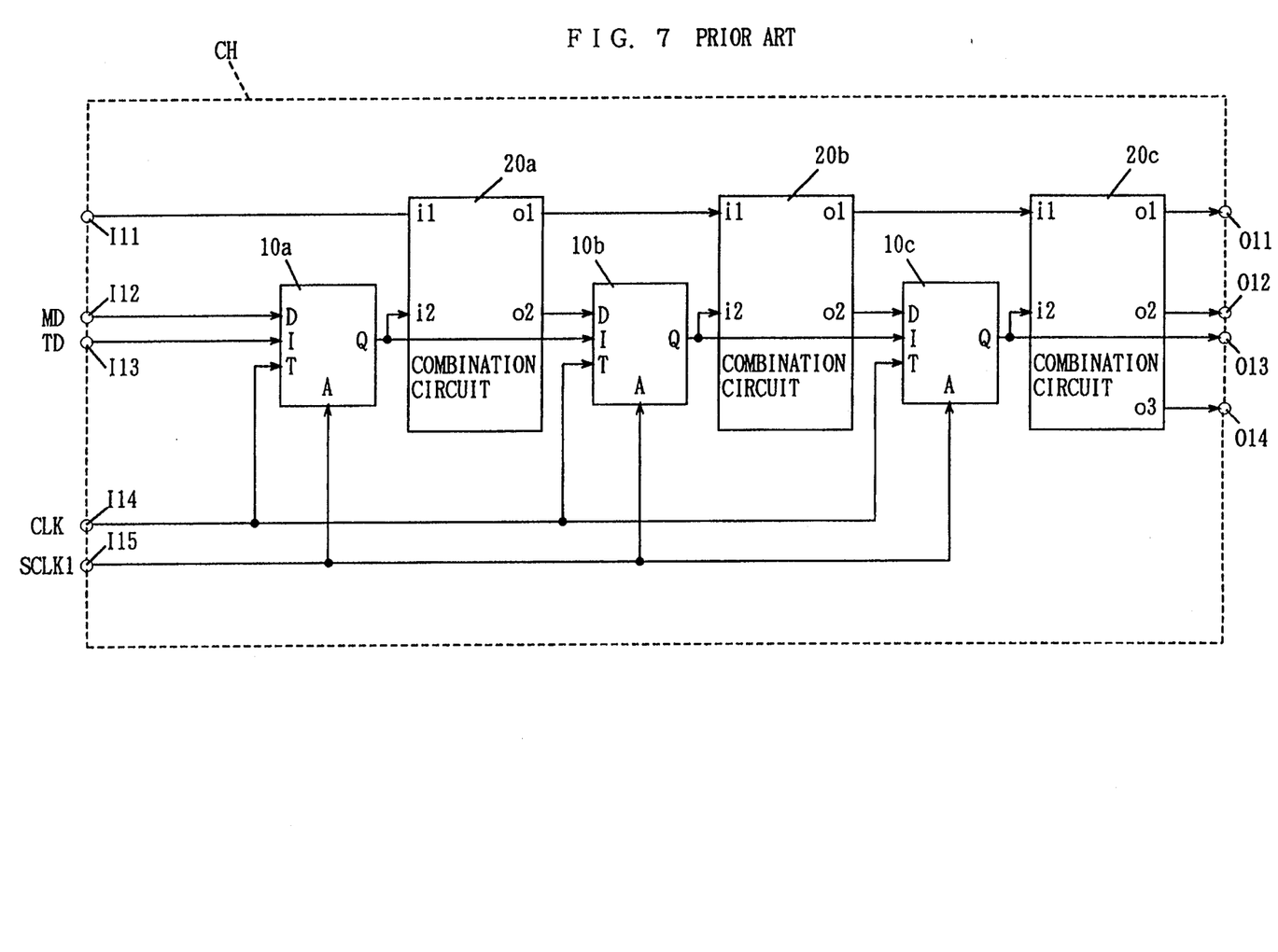
FIG. 7 is a block diagram showing an example of a structure of a semiconductor integrated circuit device including conventional flip-flop circuits.

FIG. 7 is a block diagram showing an example of the whole structure of a semiconductor integrated circuit device including flip-flop circuits having a shift function.

A plurality of flip-flop circuits 10a, 10b, 10c and a plurality of combination circuits 20a, 20b, 20c are formed on a semiconductor chip CH. A plurality of input terminals I11 to I15 receiving externally applied signals, and a plurality of output terminals O11 to O14 applying signals to the outside of the chip are also provided on the semiconductor chip CH. A combination circuit, here, means a logic circuit in which an output value at any moment is defined correspondingly to the input value at the moment.

Each of the flip-flop circuits 10a, 10b, 10c has a main data input terminal D receiving main data in normal operation, a diagnosis data input terminal I receiving diagnosis data in diagnostic operation, a main clock input terminal T receiving a main clock signal in normal operation, a shift operation clock input terminal A receiving a shift operation clock signal in diagnostic operation, and a data output terminal Q outputting main data and diagnosis data. Each of the combination circuits 20a, 20b, 20c has data input terminals i1, i2, receiving data and data output terminals o1, o2 outputting data.

Figure 8:
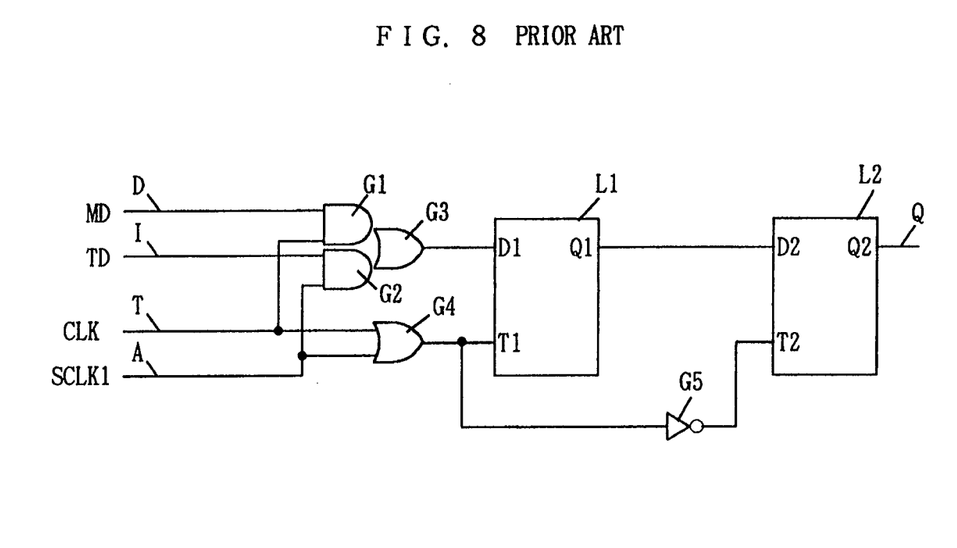
FIG. 8 is a schematic diagram showing an example of a structure of the conventional flip-flop circuit.

FIG. 8 shows a detailed structure of the flip-flop circuits 10a and 10b, 10c. The flip-flop circuit of FIG. 8 is described, for example, by S. Funatsu, N. Wakatsuki and T. Arima, in "Test generation systems in Japan", Proc. 12th Design Automation Conf., pp. 114–122 (1975).

The flip-flop circuit of FIG. 8 includes a first latch circuit L1, a second latch circuit L2, AND gates G1, G2, OR gates G3, G4, and an inverter G5.

The AND gate G1 has one input terminal connected to the main data input terminal D, and the other input terminal connected to the main clock input terminal T. The AND gate G2 has one input terminal connected to the diagnosis data input terminal I, and the other input terminal connected to the shift operation clock input terminal A. An output signal of the AND gate G1 and an output signal of the AND gate G2 are respectively applied to one input terminal and the other input terminal of the OR gate G3. The OR gate G4 has one input terminal connected to a main clock input terminal T, and the other input terminal connected to the shift operation clock input terminal A.

An output signal of the OR gate G3 is applied to a data input terminal D1 of the first latch circuit L1, and an output signal of the OR gate G4 is applied to a clock input terminal T1 of the first latch circuit L1. A data output terminal Q1 of the first latch circuit L1 is connected to a data input terminal D2 of the second latch circuit L2. An output signal of the OR gate G4 is applied through the inverter G5 to a clock input terminal T2 of the second latch circuit L2. A data output terminal Q2 of the second latch circuit L2 is connected to the data output terminal Q.

The first latch circuit L1 is a high enable D type latch circuit. Specifically, when a potential of the clock input terminal T1 becomes high, data applied to the data input terminal D1 is output from the data output terminal Q1, and when the potential of the clock input terminal T1 becomes low, the data is held therein. The second latch circuit L2 is also a high enable D type latch circuit.

Figure 9:
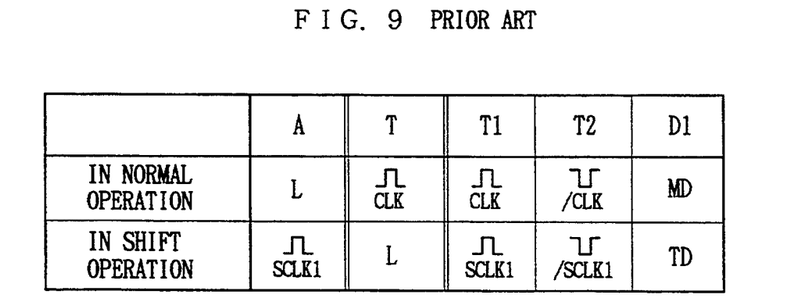
FIG. 9 is a logic state chart showing the operation of the flip-flop circuit of FIG. 8.

The operations of the flip-flop circuit of FIG. 8 will now be described with reference to a logic state chart of FIG. 9.

In normal operation, a potential of the shift operation clock input terminal A is fixed to low (L). A main clock signal CLK applied to the shift clock input terminal T is applied through the OR gate G4 to the clock input terminal T1 of the first latch circuit L1, and an inverted signal of the main clock signal CLK is applied through the inverter G5 to the clock input terminal T2 of the second latch circuit L2.

As a result, data provided from the first latch circuit L1 is applied to the second latch circuit L2, and main data MD applied to the main data input terminal D is applied through the AND gate G1 and the OR gate G3 to the data input terminal D1 of the first latch circuit L1. As described above, the first and second latch circuits L1, L2 serve as flip-flops.

In shift operation, a potential of the main clock input terminal D is fixed to low (L), and a shift operation clock signal SCLK1 is applied to the shift operation clock input terminal A. The shift operation clock signal SCLK1 is applied through the OR gate G4 to the clock input terminal T1 of the first latch circuit L1, and an inverted signal of the shift operation clock signal SCLK1 is applied through the inverter G5 to the clock input terminal T2 of the second latch circuit L2.

Accordingly, data provided from the first latch circuit L1 is applied to the second latch circuit L2, and diagnosis data (test data) TD applied to the diagnosis data input terminal I is applied through the AND gate G2 and the OR gate G3 to the data input terminal D1 of the first latch circuit L1. As described above, the first and second latch circuits L1, L2 serve as shift registers.

A procedure of diagnosing a combination circuit included in the semiconductor integrated circuit device shown in FIG. 7 will be hereinafter described. Here as an example, the operations in the diagnosis of the combination circuit 20b will be described.

First, a potential of the input terminal I14 is set to low to set potentials of the main clock input terminals T of the flip-flop circuits 10a, 10b, 10c to low. In addition, the shift operation clock signal SCLK1 is applied to the input terminal I15 to be applied to the shift operation clock input terminals A of the flip-flop circuits 10a, 10b, 10c. Then, the flip-flop circuits 10a, 10b, 10c carry out the shift operation.

The shift operation causes the diagnosis data TD of the input terminal I13 to be set to the second latch circuit L2 in the flip-flop circuit 10b through the flip-flop circuit 10a, whereby the diagnosis data TD is output from the data output terminal Q of the flip-flop circuit 10b, and applied to the data input terminal i2 of the combination circuit 20b.

Next, a potential of the input terminal I15 is set to low to set potentials of the shift operation clock input terminals A of the flip-flop circuits 10a, 10b, 10c to low. In addition, the main clock signal CLK is applied to the input terminal I14 to be applied to the main clock input terminals T of the flip-flop circuits 10a, 10b, 10c. Then, the flip-flop circuits 10a, 10b, 10c carry out the normal operation.

The normal operation causes the data provided from the data output terminal o2 of the combination circuit 20b to be taken in the first latch circuit L1 in the flip-flop circuit 10c.

Finally, the data held in the first latch circuit L1 in the flip-flop circuit 10c is shifted to the second latch circuit L2 of the flip-flop circuit 10c by shift operation, and output from the output terminal O13.

In this manner, the diagnosis data is set to the combination circuit 20b, and the data provided from the combination circuit 20b is observed. The combination circuits 20a, 20c can be diagnosed similarly.

As described above, in a semiconductor integrated circuit device including the flip-flop circuit of FIG. 8, it is necessary to set the potential of the main clock input terminal T of each flip-flop circuits to low through the input terminal I14 in shift operation. However, in the structure where data provided from a combination circuit is as a clock signal applied to the main clock input terminal T of each flip-flop circuit, the operations of the first and second latch circuits L1, L2 of each flip-flop circuit cannot be externally controlled. Therefore, the combination circuits cannot be diagnosed in such a structure.

If a set/reset signal input terminal supplied with a set/reset signal from a combination circuit is provided in each flip-flop circuit, each flip-flop circuit might be set or reset in shift operation, irrespective of the shift operation. For this reason, a set/reset signal input terminal is not provided in a flip-flop circuit.

In addition, if a timing of a rise of the shift operation clock signal SCLK1 applied to the clock input terminal T1 of the first latch circuit L1 becomes earlier than a timing of a fall of the inverted signal/SCLK1 applied to the clock input terminal T2 of the second latch circuit L2 in shift operation, the first and second latch circuits L1, L2 are simultaneously enabled for a certain period.

As a result, before the second latch circuit L2 holds the data before the change, the data after the change applied to the data input terminal D1 of the first latch circuit L1 is transferred through the first and second latch circuits L1, L2 to the data output terminal Q2 of the second latch circuit L2. This is referred to as inphase transfer. In the flip-flop circuits of FIG. 8, a problem exists that clock skew management for avoiding inphase transfer and ensuring shift operation is difficult to be carried out.

SUMMARY OF THE INVENTION

One object of the present invention is to provide a flip-flop circuit allowing design of a logic circuit capable of easy diagnosis.

Another object of the present invention is to provide a flip-flop circuit capable of easy diagnosis of a combination circuit even in a structure where data is applied to a main clock input terminal as a main clock signal, having a set/reset function, and capable of easy clock skew management.

Still another object of the present invention is to provide a flip-flop circuit having a small number of terminals, capable of easy diagnosis of a combination circuit, and ensuring set/reset operation.

A flip-flop circuit according to the present invention includes a first data terminal receiving main data in normal operation and diagnostic operation, a second data terminal receiving diagnosis data in shift operation, first and second latch circuits connected serially and having a set/reset function, a first clock terminal receiving a main clock signal in normal operation, a second clock terminal receiving a diagnosis clock signal in diagnostic operation, a set/reset terminal receiving a set/reset signal, a third clock terminal receiving a first shift operation clock signal in shift operation, a fourth clock terminal receiving a second shift operation clock signal in shift operation, and a control circuit.

The control circuit controls the first and second latch circuits in normal operation so that the first and second latch circuits respond to a main clock signal to sequentially hold and output main data, or that the first and second latch circuits respond to a set/reset signal to be set/reset.

The control circuit controls the first and second latch circuits in diagnostic operation so that the first latch circuit responds to a diagnosis clock signal to hold and output main data, or responds to a set/reset signal to be set/reset, and the second latch circuit maintains a data holding state.

The control circuit controls the first and second latch circuits in shift operation so that the first latch circuit responds to a first shift operation clock signal to hold and output diagnosis data, and the second latch circuit responds to a second shift operation clock signal to hold and provide an output signal of the first latch circuit.

The flip-flop circuit may further include a control terminal receiving a control signal. In diagnostic operation, the control circuit applies a diagnosis clock signal to the first latch circuit when the control signal is in the first state, and applies a set/reset signal to the first latch circuit when the control signal is in the second state.

Each of the first and second latch circuits responds to a clock signal to hold and output the applied data.

The control circuit, in normal operation, responds to a main clock signal to apply main data and a clock signal to the first latch circuit, and apply a clock signal to the second latch circuit. The control circuit, in diagnostic operation, responds to a diagnosis clock signal to apply main data and a clock signal to the first latch circuit, or apply a set/reset signal to the first latch circuit. The control circuit, in shift operation, responds to a first shift operation clock signal to apply diagnosis data and a clock signal to the first latch circuit, and responds to a second shift operation clock signal to apply a clock signal to the second latch circuit.

Particularly, the control circuit, in diagnostic operation, responds to a diagnosis clock signal to apply main data and a clock signal to the first latch circuit when the control signal is in the first state, and applies a set/reset signal to the first latch circuit when the control signal is in the second state.

In the flip-flop circuit, the first and second latch circuits constitute a master-slave flip-flop in normal operation. In response to a main clock signal, an output signal of the first latch circuit is applied to the second latch circuit and held therein, and main data is applied to the first latch circuit and held therein.

In diagnostic operation, when the control signal is in the first state, main data is applied to the first latch circuit and held therein in response to a diagnosis clock signal. At this time, since a clock signal is not applied to the second latch circuit, data in the second latch circuit is held therein. When the control signal is in the second state, a set/reset signal is applied to the first latch circuit in response to the control signal, whereby the first latch circuit are set or reset.

In shift operation, an output signal of the first latch circuit is applied to the second latch circuit and held therein in response to a second shift operation clock signal. Diagnosis data is applied to the first latch circuit and held therein in response to a first shift operation clock signal. At this time, since set/reset signals are not applied to the first and second latch circuits, the first and second latch circuits cannot be set or reset.

As described above, in diagnostic operation, diagnostic operation can be carried out even in a structure where data is applied as a main clock signal from other circuits to the first clock terminal of the flip-flop circuit, since the first latch circuit is controlled in response to a diagnosis clock signal.

In addition, the first and second latch circuits cannot be set or reset in shift operation, since set/reset signals are not applied to the first and second latch circuits in shift operation.

Furthermore, shift operation can be ensured since the first latch circuit is controlled in response to a first shift operation clock signal, and the second latch circuit is controlled in response to a second shift operation clock signal in shift operation.

Where a control terminal receiving a control signal is not provided, in diagnostic operation, main data and a clock signal, a set/reset signal are applied to the first latch circuit in response to a diagnosis clock signal. At this time, a clock signal and a set/reset signal are not applied to the second latch circuit, so that data in the second latch circuit is held therein.

According to the present invention, a flip-flop circuit having a set/reset function can be obtained in which diagnosis of a combination circuit can be carried out even in a structure where data provided from other circuits to a first clock terminal is applied as a main clock signal, and clock skew management can be readily carried out for ensuring shift operation.

Particularly, where a control terminal receiving a control signal is not provided, a flip-flop circuit having a small number of terminals, and capable of ensuring set/reset operation can be obtained.

Consequently, employing a flip-flop circuit of the present invention, a logic circuit can be designed, the entire diagnosis of which can be readily carried out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(1) First Embodiment

Figure 1:
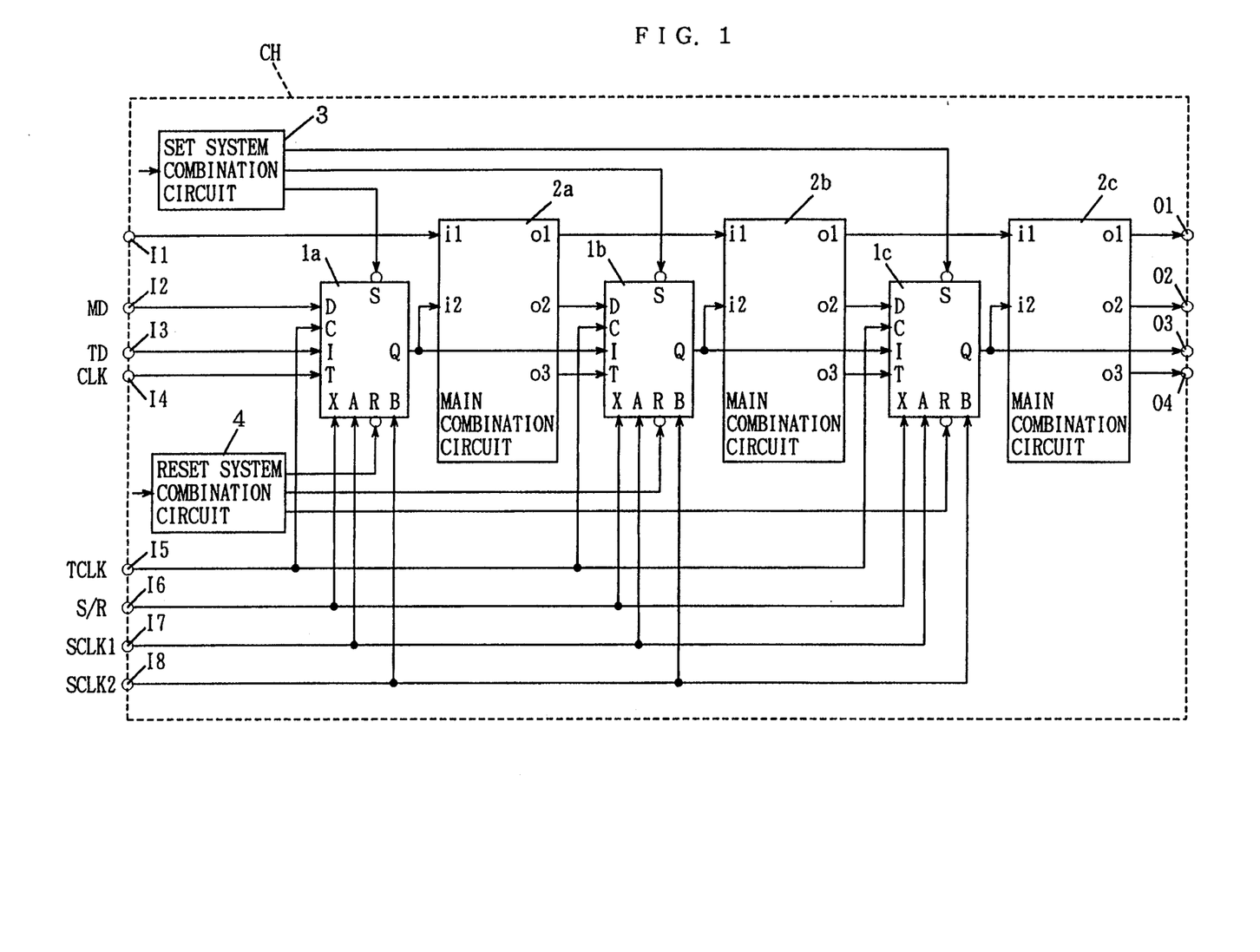
FIG. 1 is a block diagram showing an example of a semiconductor integrated circuit device including flip-flop circuits according to a first embodiment.

FIG. 1 is a block diagram showing an example of the entire structure of a semiconductor integrated circuit device including flip-flop circuits according to a first embodiment of the present invention.

A plurality of flip-flop circuits 1a, 1b, 1c, a plurality of main combination circuits 2a, 2b, 2c, a set system combination circuit 3, and a reset system combination circuit 4 are formed on a semiconductor chip CH. Input terminals I1 to I8 and output terminals O1 to O4 are also provided on the semiconductor chip CH.

Each of the flip-flop circuits 1a, 1b, 1c has a main data input terminal D, a diagnosis clock input terminal C, a diagnosis data input terminal I, and a main clock input terminal T. Each of the flip-flop circuits 1a, 1b, 1c also has a set/reset system control signal input terminal X, a first phase shift operation clock input terminal A, a reset signal input terminal R, a second phase shift operation clock input terminal B, a data output terminal Q, and a set signal input terminal S.

Each of the main combination circuits 2a, 2b, 2c has data input terminals i1, i2 and data output terminals o1, o2, o3.

The input terminals I2, I3, I4 are respectively connected to the main data input terminal D, the diagnosis data input terminal I, and the main clock input terminal T of the flip-flop circuit 1a. The data output terminal Q of the flip-flop circuit 1a is connected to the data input terminal i2 of the main combination circuit 2a and the diagnosis data input terminal I of the flip-flop circuit 1b. The data output terminals o2, o3 of the main combination circuit 2a are connected to the main data input terminal D and the main clock input terminal T of the flip-flop circuit 1b, respectively.

The data output terminal Q of the flip-flop circuit 1b is connected to the data input terminal i2 of the main combination circuit 2b and the diagnosis data input terminal I of the flip-flop circuit 1c. The data output terminals o2, o3 of the main combination circuit 2b are connected to the main data input terminal D and the main clock input terminal T of the flip-flop circuit 1c, respectively.

The data output terminal Q of the flip-flop circuit 1c is connected to the data input terminal i2 of the main combination circuit 2c and the output terminal o3. The data output terminals o1, o2, o3 of the main combination circuit 2c are connected to the output terminals O1, O2, O4, respectively.

The input terminal I5 is connected to the diagnosis clock input terminals C of the flip-flop circuits 1a, 1b, 1c through a diagnosis clock signal line. The input terminal I6 is connected to the set/reset system control signal input terminals X of the flip-flop circuits 1a, 1b, 1c through a set/reset system control signal line. The input terminal I7 is connected to the first phase shift operation clock input terminals A of the flip-flop circuits 1a, 1b, 1c through a first phase shift operation clock signal line. The input terminal I8 is connected to the second phase shift operation clock input terminals B of the flip-flop circuits 1a, 1b, 1c through a second phase shift operation clock signal line.

Output signals of the set system combination circuit 3 are respectively applied to the set signal input terminals S of the flip-flop circuits 1a, 1b, 1c. Output signals of the reset system combination circuit 4 are respectively applied to the reset signal input terminals R of the flip-flop circuits 1a, 1b, 1c.

Figure 2:
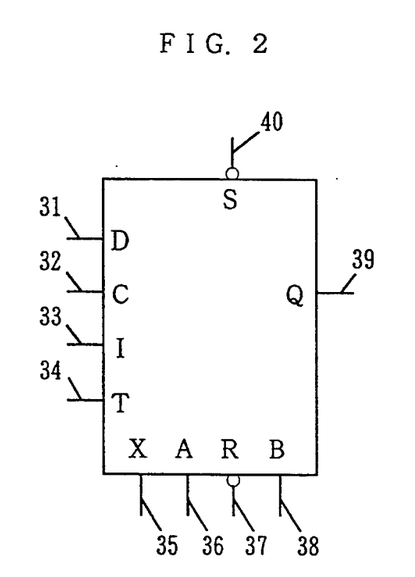
FIG. 2 is a block diagram showing a pin arrangement of the flip-flop circuit according to the first embodiment.

FIG. 2 shows a pin arrangement of a flip-flop circuit used in the semiconductor integrated circuit device of FIG. 1. Pins 31, 32, 33, 34 are connected to the main data input terminal D, the diagnosis clock input terminal C, the diagnosis data input terminal I, and the main clock input terminal T, respectively. Pins 35, 36, 37, 38 are connected to the set/reset system control signal input terminal X, the first phase shift operation clock input terminal A, the reset signal input terminal R, and the second phase shift operation clock input terminal B, respectively. A pin 39 is connected to the data output terminal Q, and a pin 40 is connected to the set signal input terminal S.

Figure 3:
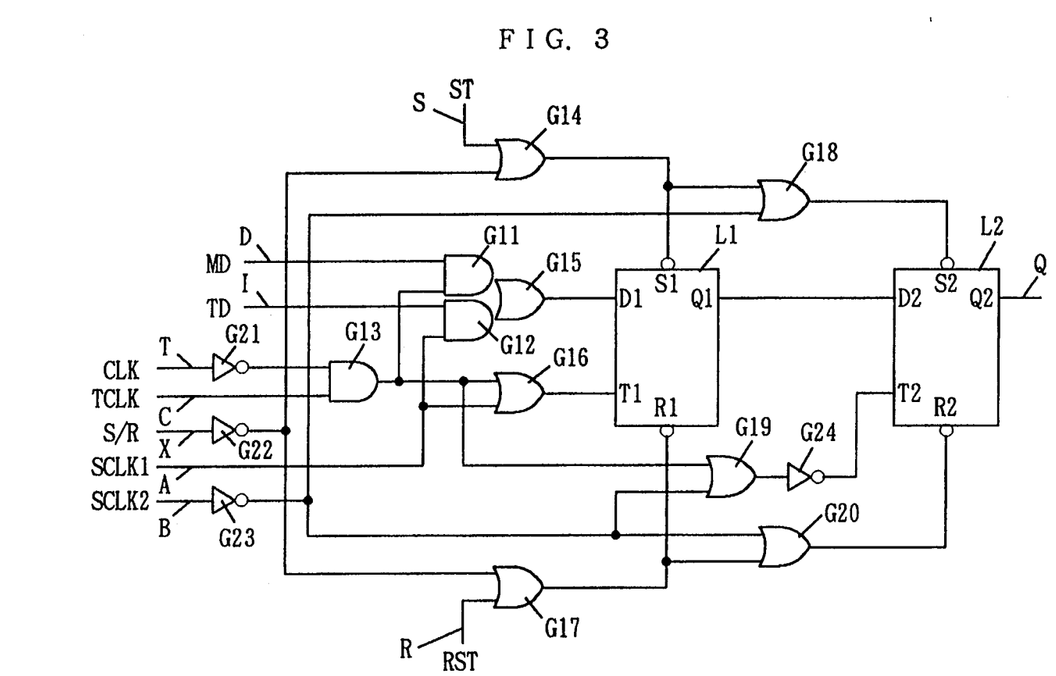
FIG. 3 is a schematic diagram showing a structure of the flip-flop circuit according to the first embodiment.

FIG. 3 is a schematic diagram showing a detailed structure of the flip-flop circuit according to the first embodiment. The flip-flop circuit of FIG. 3 includes the first latch circuit L1, the second latch circuit L2, AND gates G11, G12, G13, OR gates G14, G15, G16, G17, G18, G19, G20, and inverters G21, G22, G23, G24.

The main data input terminal D is connected to one input terminal of the AND gate G11, and the diagnosis data input terminal I is connected to one input terminal of the AND gate G12. The main clock input terminal T is connected to one input terminal of the AND gate G13 through the inverter G21, and the diagnosis clock input terminal C is connected to the other input terminal of the AND gate G13. An output terminal of the AND gate G13 is connected to the other input terminal of the AND gate G11, one input terminal of the OR gate G16, and one input terminal of the OR gate G19.

The set/reset system control signal input terminal X is connected through the inverter G22 to one input terminal of the OR gate G14 and one input terminal of the OR gate G17. The first phase shift operation clock input terminal A is connected to the other input terminal of the AND gate G12 and the other input terminal of the OR gate G16. The second phase shift operation clock input terminal B is connected through the inverter G23 to one input terminal of the OR gate G18, the other input terminal of the OR gate G19, and one input terminal of the OR gate G20.

An output terminal of the AND gate G11 and an output terminal of the AND gate G12 are connected to one input terminal and the other input terminal of the OR gate G15, respectively. An output terminal of the OR gate G15 is connected to a data input terminal D1 of the first latch circuit L1. An output terminal of the OR gate G16 is connected to a clock input terminal T1 of the first latch circuit L1.

The set signal input terminal S is connected to the other input terminal of the OR gate G14, and the reset signal input terminal R is connected to the other input terminal of the OR gate G17. An output terminal of the OR gate G14 is connected to a set terminal S1 of the first latch circuit L1 and the other input terminal of the OR gate G18. An output terminal of the OR gate G17 is connected to a reset terminal R1 of the first latch circuit L1 and the other input terminal of the OR gate G20.

A data output terminal Q1 of the first latch circuit L1 is connected to a data input terminal D2 of the second latch circuit L2. An output terminal of the OR gate G19 is connected through the inverter G24 to a clock input terminal T2 of the second latch circuit L2. An output terminal of the OR gate G18 is connected to a set terminal S2 of the second latch circuit L2, and an output terminal of the OR gate G20 is connected to a reset terminal R2 of the second latch circuit L2. A data output terminal Q2 of the second latch circuit L2 is connected to the data output terminal Q.

The first and second latch circuits L1, L2 are high enable D type latch circuits, as well as the first and second latch circuits L1, L2 shown in FIG. 8.

Figure 4:
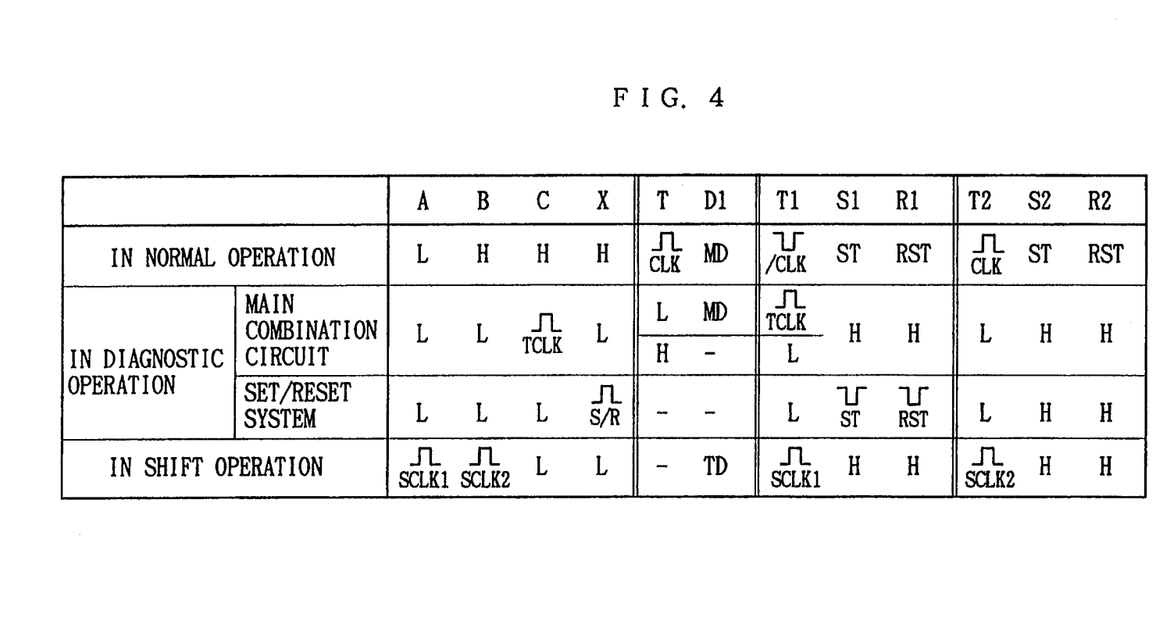
FIG. 4 is a logic state chart showing the operation of the flip-flop circuit of FIG. 3.

Operation of the flip-flop circuit of FIG. 3 will now be described with reference to a logic state chart of FIG. 4. In the flip-flop circuit, normal operation, diagnostic operation, and shift operation are possible. Determination of each operation is made according to signal values of the first phase shift operation clock input terminal A, the second phase shift operation clock input terminal B, the diagnosis clock input terminal C, and the set/reset system control signal input terminal X.

(a) Normal operation

A potential of the first phase shift operation clock input terminal A is set to low (L), potentials of the second shift phase operation clock input terminal B, the diagnosis clock input terminal C, and the set/reset system control signal input terminal X are set to high (H).

The inverted signal /CLK of the main clock signal CLK applied to the main clock input terminal T is applied to the clock input terminal T1 of the first latch circuit L1 through the inverter G21, the AND gate G13, and the OR gate G16, and a signal of the same phase as that of the main clock signal CLK is applied to the clock input terminal T2 of the second latch circuit L2 through the OR gate G19 and the inverter G24.

Consequently, an output signal of the first latch circuit L1 is applied to the second latch circuit L2 and held therein, and the main data MD applied to the main data input terminal D is applied through the AND gate G11 and the OR gate G15 to the data input terminal D1 of the first latch circuit L1, and held therein. AS described above, the first and second latch circuits L1, L2 serve as a master-slave flip-flop.

When a set signal ST at a low level is applied to the set signal input terminal S, the set signal ST is applied through the OR gate G14 to the set terminal S1 of the first latch circuit L1, and further applied through the OR gate G18 to the set terminal S2 of the second latch circuit L2, whereby the first and second latch circuits L1, L2 are set.

When a reset signal RST at a low level is applied to the reset signal input terminal R, the reset signal RST is applied through the OR gate G17 to the reset terminal R1 of the first latch circuit L1, and further applied through the OR gate G20 to the reset terminal R2 of the second latch circuit L2, whereby the first and second latch circuits L1, L2 are reset.

(b) Diagnostic Operation

In diagnosis of a main combination circuit, the potentials of the first phase shift operation clock input terminal A, the second phase shift operation clock input terminal B, and the set/reset system control signal input terminal X are set to low, and a diagnosis clock signal TCLK is applied to the diagnosis clock input terminal C.

If a potential of the main clock input terminal T is low, the diagnosis clock signal TCLK is applied to the clock input terminal T1 of the first latch circuit L1 through the AND gate G13 and the OR gate G16, whereby the main data MD applied to the main data input terminal D is applied through the AND gate G11 and the OR gate G15 to the data input terminal D1 of the first latch circuit L1, and held therein.

At this time, since a potential of the clock input terminal T2 of the second latch circuit L2 is fixed to low, data in the second latch circuit L2 is held therein. In addition, since potentials of the set terminal S1 and the reset terminal R1 of the first latch circuit L1 and potentials of the set terminal S2 and the reset terminal R2 of the second latch circuit L2 are fixed to low, the first and second latch circuits L1, L2, are neither set nor reset.

If the potential of the main clock input terminal T is high, a potential of the clock input terminal T1 of the first latch circuit L1 becomes low. Therefore, the main data MD applied to the main data input terminal D is not taken in the first latch circuit L1, and data in the first latch circuit L1 is held therein.

In diagnosis of a set/reset system combination circuit, the potentials of the first phase shift operation clock input terminal A, the second phase shift operation clock input terminal B, and the diagnosis clock input terminal C are set to low, and a set/reset system control signal S/R at a high level is applied to the set/reset system control signal input terminal X.

When the set signal ST at a low level is applied to the set signal input terminal S, the set signal ST is applied through the OR gate G14 to the set terminal S1 of the first latch circuit L1, and the first latch circuit L1 is set.

When the reset signal RST at a low level is applied to the reset signal input terminal R, the reset signal RST is applied through the OR gate G17 to the reset terminal R1 of the first latch circuit L1, and the first latch circuit L1 is reset.

At this time, since the potential of the clock input terminal T2 of the second latch circuit L2 is fixed to low, data in the second latch circuit L2 is held therein. In addition, since the potentials of the set terminal S2 and the reset terminal R2 of the second latch circuit L2 are fixed to high, the second latch circuit L2 is neither set nor reset.

(c) Shift Operation

The potentials of the diagnosis clock input terminal C and the set/reset system control signal input terminal X are set to low, the first phase shift operation clock signal SCLK1 is applied to the first phase shift operation clock input terminal A, and a second phase shift operation clock signal SCLK2 is applied to the second phase shift operation clock input terminal B.

The first phase shift operation clock signal SCLK1 is applied to the clock input terminal T1 of the first latch circuit L1 through the OR gate G16, and the second phase shift operation clock signal SCLK2 is applied to the clock input terminal T2 of the second latch circuit L2 through the inverter G23, the OR gate G19, and the inverter G24.

In response to the second phase shift operation clock signal SCLK2 data provided from the first latch circuit L1 is applied to the second latch circuit L2 and held therein, and in response to the first phase shift operation clock signal SCLK1 the diagnosis data TD applied to the diagnosis data input terminal I is applied through the AND gate G12 and the OR gate G15 to the first latch circuit L1 and held therein.

As described above, the first latch circuit L1 and the second latch circuit L2 constitute a shift register between the main data input terminal D and the data output terminal Q.

At this time, since potentials of the set terminal S1 and the reset terminal R1 of the first latch circuit L1 and potentials of the set terminal S2 and the reset terminal R2 of the second latch circuit L2 are fixed to high, the first and second latch circuits L1, L2 are neither set nor reset.

The diagnosis procedure of the semiconductor integrated circuit device shown in FIG. 1 will now be described. Prior to diagnosis of the main combination circuits 2a, 2b, 2c, the set system combination circuit 3 and the reset system combination circuit 4, the input state and output state of each circuit in each timing have been calculated in advance, assuming that they are normal.

The operation in which the main combination circuit 2b is diagnosed will be hereinafter described as an example.

(a) First, potentials of the input terminals I5, I6 are set to low, the first phase shift operation clock signal SCLK1 is applied to the input terminal I7, and the second phase shift operation clock signal SCLK2 is applied to the input terminal I8, then the flip-flop circuits 1a, 1b, 1c carry out shift operation.

The shift operation causes the diagnosis data TD applied to the input terminal I3 to be set through the flip-flop circuit 1a to the second latch circuit L2 in the flip-flop circuit 1b. The diagnosis data TD is provided from the data output terminal Q of the flip-flop circuit 1b, and applied to the input terminal i2 of the main combination circuit 2b.

During the shift operation, since the potential of the set/reset system control signal input terminal X of the flip-flop circuit 1b is fixed to low, a set signal and a reset signal are not applied to the first and second latch circuits L1, L2 in the flip-flop circuit 1b.

(b) Next, potentials of the input terminals I6, I7, I8 are set to low, and the diagnosis clock signal TCLK is applied to the input terminal I5, then the flip-flop circuits 1a, 1b, 1c carry out diagnosis operation.

If the potential of the main clock input terminal T of the flip-flop circuit 1c is low, the data provided from the data output terminal o2 of the main combination circuit 2b is taken in the first latch circuit L1 in the flip-flop circuit 1c.

At this time, since the potentials of the second phase shift operation clock input terminals B of the flip-flop circuits 1a, 1b, 1c are fixed to low, data in the second latch circuits L2 in the flip-flop circuits 1a, 1b, 1c are held therein.

If the potential of the main clock input terminal T of the flip-flop circuit 1c is high, the data provided from the data output terminal o2 of the main combination circuit 2b is not taken in the first latch circuit L1 in the flip-flop circuit 1c.

(c) Finally the potentials of the input terminals I5, I6 are set to low, and the first phase shift operation clock signals SCLK1 and the second phase shift operation clock signal SCLK2 are respectively applied to the input terminals I7, I8, then the flip-flop circuits 1a, 1b, 1c carry out shift operation.

The shift operation causes the data latched in the first latch circuit L1 in the flip-flop circuit 1c to be applied through the second latch circuit L2 in the flip-flop circuit 1c to the output terminal O3.

As described above, diagnosis data is set to the main combination circuit 2b, and the data provided from the main combination circuit 2b can be observed. Diagnosis of the other main combination circuits 2a, 2c can also be made in the same manner.

The operation in which the set system combination circuit 3 is diagnosed will be hereinafter described.

(a) First, "0" is set as the diagnosis data TD through the input terminal I3 to the first latch circuit L1 of each of the flip-flop circuits 1a, 1b, 1c.

(b) Next, the potentials of the input terminals I5, I7, I8 are set to low, and the set/reset system control signal S/R is applied to the input terminal I6, then the flip-flop circuits 1a, 1b, 1c carry out diagnosis operation.

The diagnostic operation causes the set signals ST at a low level provided from the set system combination circuit 3 to be applied to the set terminals S of the flip-flop circuits 1a, 1b, 1c. If the set system combination circuit 3 is normal, the diagnosis data "0" in the first latch circuit L1 in each of the flip-flop circuits 1a, 1b, 1c are set to "1".

At this time, since the potentials of the second phase shift operation clock input terminals B of the flip-flop circuits 1a, 1b, 1c are fixed to low, data in the second latch circuits L2 in the flip-flop circuits 1a, 1b, 1c are held therein.

(c) Finally, the data held in the first latch circuits L1 of the flip-flop circuits 1a, 1b, 1c are sequentially provided from the output terminal O3 by shift operation, and observed.

The operation in which the reset system combination circuit 4 is diagnosed will now be described.

(a) First, "1" is set as the diagnosis data TD through the input terminal I3 to the first latch circuits L1 in the flip-flop circuits 1a, 1b, 1c by shift operation.

(b) Next, the reset signal RST at a low level output from the reset system combination circuit 4 is applied to the reset terminals R of the flip-flop circuit 1a, 1b, 1c by diagnostic operation.

If the reset system combination circuit 4 is normal, the diagnosis data "1" in the first latch circuits L1 of the flip-flop circuits 1a, 1b, 1c are reset to "0". At this time, data in the second latch circuits L2 of the flip-flop circuits 1a, 1b, 1c are held therein.

(c) Finally, the data held in the first latch circuits L1 of the flip-flop circuits 1a, 1b, 1c are sequentially output from the output terminal O3 by shift operation, and observed.

According to the flip-flop circuit of FIG. 3, inphase transfer does not occur therein since the data in the second latch circuit L2 is held in the diagnostic operation. In addition, shift operation can be ensured without considering clock skew because a clock signal for shift operation is formed of two phase clock signals.

(2) Second Embodiment

Figure 5:
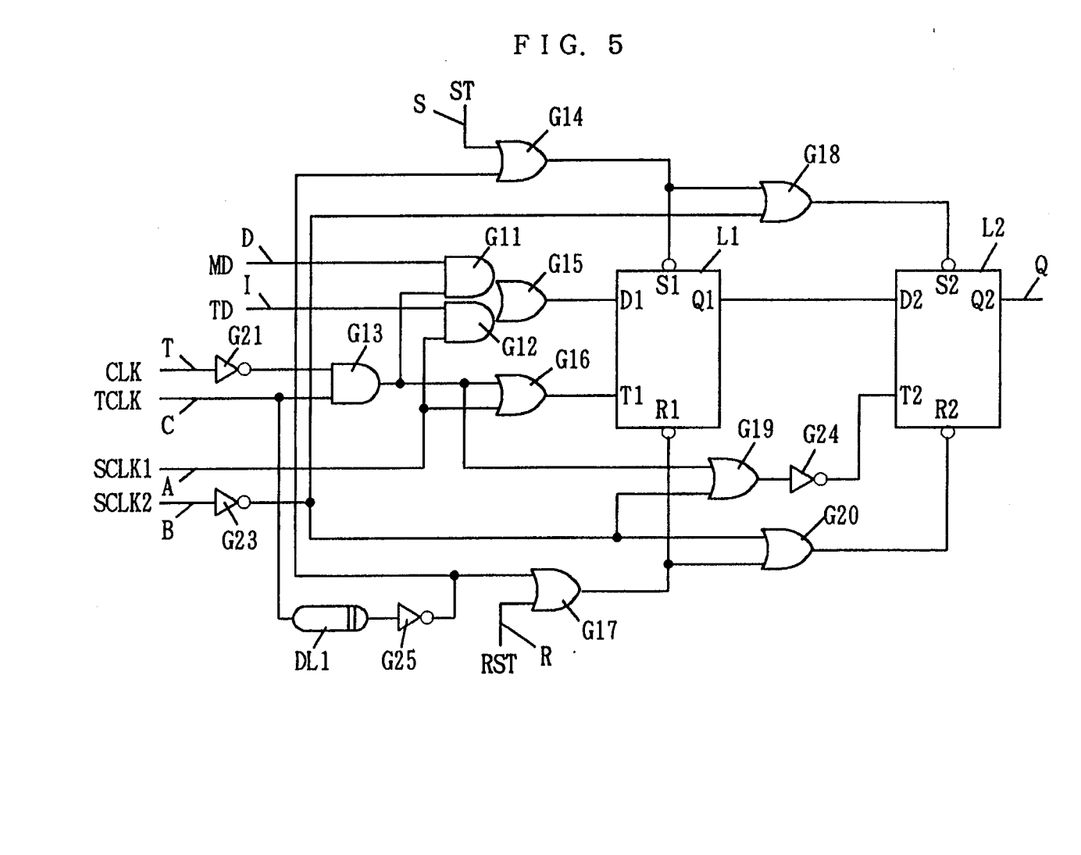
FIG. 5 is a schematic diagram showing a structure of the flip-flop circuit according to a second embodiment.

FIG. 5 is a schematic diagram showing a structure of the flip-flop circuit according to the second embodiment of the present invention.

The flip-flop circuit of FIG. 5 is different from the flip-flop circuit of FIG. 3 in that the set/reset system control signal input terminal X receiving the set/reset system control signal S/R and the inverter G22 are not provided therein, and that the diagnosis clock input terminal C is connected through a delay element DL1 and the inverter G25 to a set/reset system control signal line. The set/reset system control signal line is connected to one input terminal of the OR gate G14 and one input terminal of the OR gate G17.

The delay element DL1 is, for example, formed of a plurality of inverters connected serially. The other part of the structure is the same as that shown in FIG. 3.

Figure 6:
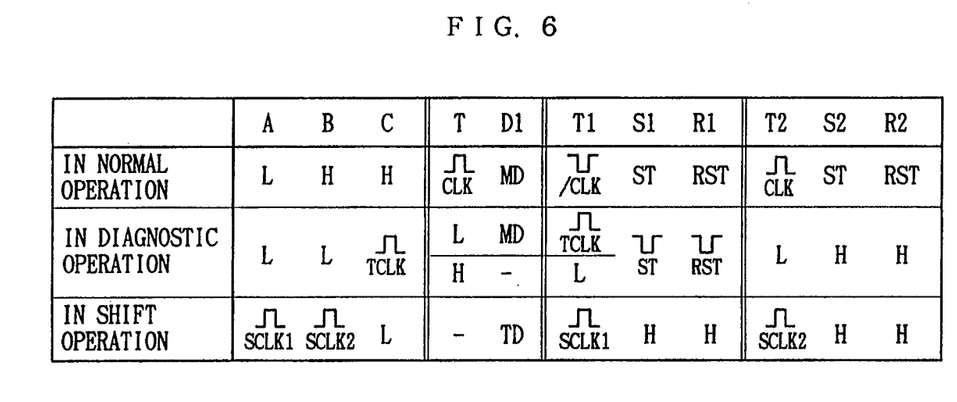
FIG. 6 is a logic state chart showing the operation of the flip-flop circuit of FIG. 5.

The operation of the flip-flop circuit of FIG. 5 will be described in reference to a logic state chart of FIG. 6. The normal operation and shift operation of the flip-flop circuit of FIG. 5 are the same as those of the flip-flop circuit of FIG. 3, respectively. Therefore, only the diagnostic operation will now be described.

The potentials of the first phase shift operation clock input terminal A and the second phase shift operation clock input terminal B are set to low, and the diagnosis clock input terminal C is supplied with the diagnosis clock signal TCLK at a high level.

As a result, the potential of the clock input terminal T2 of the second latch circuit L2 is fixed to low, and the potentials of the set terminal S2 and the reset terminal R2 of the second latch circuit L2 are fixed to high. Consequently, data in the second latch circuit L2 is held.

If the potential of the main clock input terminal T is low, the diagnosis clock signal TCLK is applied through the AND gate G13 and the OR gate G16 to the clock input terminal T1 of the first latch circuit L1, whereby the main data MD of the main data input terminal D are applied through the AND gate G11 and the OR gate G15 to the data input terminal D1 of the first latch circuit L1 and held therein.

If a potential of the set signal input terminal S is low a prescribed time after inputting the diagnosis clock signal TCLK, an inverted signal of the diagnosis clock signal TCLK is applied through the OR gate G14 to the set terminal S1 of the first latch circuit L1 as the set signal ST at a low level, then the latch circuit L1 is set.

If a potential of the reset signal input terminal R is low a prescribed time after inputting the diagnosis clock signal TCLK, the inverted signal of the diagnosis clock signal TCLK is applied through the OR gate G17 to the reset terminal R1 of the first latch circuit L1 as the reset signal RST at a low level, then the first latch circuit L1 is reset.

If the potential on the main clock input terminal T is high, the potential of the clock input terminal T1 of the first latch circuit L1 is set to low. Accordingly, the main data MD of the main data input terminal D is not applied to the data input terminal T1 of the first latch circuit L1.

If the potential of the set signal input terminal S is low a prescribed time after inputting the diagnosis clock signal TCLK, the inverted signal of the diagnosis clock signal TCLK is applied through the OR gate G14 to the set terminal S1 of the first latch circuit L1 as the set signal ST at a low level, then the first latch circuit L1 is set.

If the potential of the reset signal input terminal R is low a prescribed time after inputting the diagnosis clock signal TCLK, the inverted signal of the diagnosis clock signal TCLK is applied through the OR gate G17 to the reset terminal R1 of the first latch circuit L1 as the reset signal RST at a low level, then the first latch circuit L1 is reset.

In the flip-flop circuit of FIG. 5, employing the delay element DL1, the set and reset operation of the first latch circuit L1 can be controlled more securely with the diagnosis clock signal TCLK, with the number of the terminals being reduced.

The diagnosis of the main combination circuits 2a, 2b, 2c, the set system combination circuit 3 and the reset system combination circuit 4 can be carried out where the flip-flop circuits of FIG. 5 are used as the flip-flop circuits 1a, 1b, 1c of the semiconductor integrated circuit device of FIG. 1 as well, by the shift operation and diagnostic operation of the flip-flop circuits.

The first and second latch circuits L1, L2 in the flip-flop circuits of FIGS. 3 and 5 constitute a flip-flop of a positive edge trigger type. However, the first and second latch circuits L1, L2 may constitute a flip-flop of a negative edge trigger type.

In addition, the flip-flop circuits of FIGS. 3 and 5 are applicable to other semiconductor integrated circuit devices of various structures, not limited to the semiconductor integrated circuit device shown in FIG. 1.

Furthermore, the set signal input terminal S and the reset signal input terminal R may be removed from the flip-flop circuits of FIGS. 3 and 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flip-flop circuit comprising:
   a first data terminal for receiving main data in normal operation and diagnostic operation;
   a second data terminal for receiving diagnosis data in shift operation;
   first and second latch means connected serially, and having a set/reset function;
   a first clock terminal for receiving a main clock signal in normal operation;
   a second clock terminal for receiving a diagnosis clock signal in diagnostic operation;
   a set/reset terminal for receiving a set/reset signal;
   a third clock terminal for receiving a first shift operation clock signal in shift operation;
   a fourth clock terminal for receiving a second shift operation clock signal in shift operation; and
   control means for controlling said first and second latch means so that, in normal operation, said first and second latch means respond to said main clock signal to sequentially hold and provide said main data, or respond to said set/reset signal to be set/reset; that in diagnostic operation, said first latch means responds to said diagnosis clock signal to hold and provide said main data, or responds to said set/reset signal to be set/reset, and said second latch means maintains data holding state; and that in shift operation, said first latch means responds to said first shift operation clock signal to hold and provide said diagnosis data, and said second latch means responds to said second shift operation clock signal to hold and provide an output signal of said first latch means.

2. The flip-flop circuit according to claim 1, wherein said control means identify said normal operation, said diagnostic operation and said shift operation according to signals applied to said second clock terminal, said third clock terminal, and said fourth clock terminal.

3. The flip-flop circuit according to claim 1 further comprising a control terminal for receiving a control signal, wherein
   said control means apply said diagnosis clock signal to said first latch means when said control signal is in a first state, and apply said set/reset signal to said first latch means when said control signal is in a second state, in diagnostic operation.

4. The flip-flop circuit according to claim 3, wherein said control means identify said normal operation, said diagnostic operation and said shift operation according to signals of said second clock terminal, said third clock terminal, and said fourth clock terminal.

5. The flip-flop circuit according to claim 1, wherein
   each of said first and second latch means holds and provides the applied data in response to a clock signal, and
   said control means includes logic means, in normal operation, responsive to said main clock signal for applying said main data and a clock signal to said first latch circuit and applying a clock signal to said second latch means; in diagnostic operation, responsive to said diagnosis clock signal for applying said main data and a clock signal to said first latch means, or applying said set/reset signal to said first latch means; and in shift operation, responsive to said first shift operation clock signal for applying said diagnosis data and a clock signal to said first latch means, and responsive to said second shift operation clock signal for applying a clock signal to said second latch means.

6. The flip-flop circuit according to claim 3, wherein
   each of said first and second latch means holds and provides the applied data in response to a clock signal, and said control means includes
   logic means, in normal operation, responsive to said main clock signal for applying said main data and a clock signal to said first latch means and applying a clock signal to said second latch means; in diagnostic operation, responsive to said diagnosis clock signal for applying said main data and a clock signal to said first latch means when said control signal is in a first state, and applying said set/reset signal to set first latch means when said control signal is in a second state; in shift operation, responsive to said first shift operation clock signal for applying said diagnosis data and a clock signal to said first latch means, and responsive to said second shift operation clock signal for applying a clock signal to said second latch means.

7. The flip-flop circuit according to claim 1, wherein
   said set/reset signal includes a set signal and a reset signal, and
   said set/reset terminal includes a set terminal for receiving said set signal and a reset terminal for receiving said reset signal.

8. The flip-flop circuit according to claim 3, wherein
   said set/reset signal includes a set signal and a reset signal, and
   said set/reset terminal includes a set terminal for receiving said set signal and a reset terminal for receiving said reset signal.

9. The flip-flop circuit according to claim 6, wherein each of said first and second latch means includes a D type latch circuit.

10. A flip-flop circuit, comprising:
    a first data terminal for receiving main data;
    a second data terminal for receiving diagnosis data;

a first latch means responsive to a first clock signal for holding and providing the main data or the diagnosis data, and having a set/reset function;

a second latch means responsive to a second clock signal for holding and providing an output signal of said first latch means, and having a set/reset function;

a first clock terminal for receiving a main clock signal;

a second clock terminal for receiving a diagnosis clock signal;

a set/reset terminal for receiving a set/reset signal;

a third clock terminal for receiving a first shift operation clock signal;

a fourth clock terminal for receiving a second shift operation clock signal; and logic means, in normal operation, responsive to said main clock signal for applying said main data and a first clock signal to said first latch means and applying a second clock signal to said second latch means; in diagnostic operation, responsive to said diagnosis clock signal for applying said main data and a first clock signal to said first latch means, or applying said set/reset signal to said first latch means; and in shift operation, responsive to said first shift operation clock signal for applying said diagnosis data and a first clock signal to said first latch means, and responsive to said second shift operation clock signal for applying a second clock signal to said second latch means.

11. The flip-flop circuit according to claim 10, further comprising a control terminal for receiving a control signal, wherein said logic means respond to said diagnosis clock signal to apply said main data and a first clock signal to said first latch means when said control signal is in a first state, and applying said set/reset signal to said first latch means when said control signal is in a second state, in diagnostic operation.

12. A semiconductor integrated circuit device, comprising:

a plurality of flip-flop circuits connected serially;

a plurality of combination circuits;

a first input terminal for receiving diagnosis data externally;

a second input terminal for receiving a diagnosis clock signal externally;

a third input terminal for receiving a first shift operation clock signal externally;

a fourth input terminal for receiving a second shift operation clock signal externally; and an output terminal;

each of said plurality of flip-flop circuits comprising a first data terminal for receiving main data in normal operation and diagnostic operation, a second data terminal for receiving diagnosis data in shift operation, first and second latch means connected serially, and having a set/reset function, a first clock terminal for receiving a main clock signal in normal operation, a second clock terminal for receiving a diagnosis clock signal in diagnostic operation, a set/reset terminal for receiving a set/reset signal, a third clock terminal for receiving a first shift operation clock signal in shift operation, a fourth clock terminal for receiving a second shift operation clock signal in shift operation, and control means for controlling said first and second latch means so that in normal operation, said first and second latch means respond to said main clock signal to sequentially hold and output said main data, or respond to said set/reset signal to be set/reset, in diagnostic operation, said first latch means responds to said diagnosis clock signal to hold and output said main data, or responds to said set/reset signal to be set/reset, and said second latch means maintains a data holding state, and in shift operation, said first latch means responds to said first shift operation clock signal to hold and output said diagnosis data, and said second latch means holds and provides an output signal of said first latch means, wherein said second data terminal of the flip-flop circuit of the first stage is connected to said first input terminal, and said second data terminal of each of the flip-flop circuits of the second stage to the last stage is connected to an output of said second latch means of the flip-flop circuits of the preceding stage, the second clock terminal of each flip-flop circuit is connected to said second input terminal, and said third clock terminal of each flip-flop circuit is connected to said third input terminal, and said fourth clock terminal of each flip-flop circuit is connected to said fourth input terminal, and said first data terminal of each flip-flop circuit receives main data externally or from any one of said plurality of combination circuits, said first clock terminal of each flip-flop circuit receives a main clock signal externally or from any one of said plurality of combination circuits, the set/reset terminal of each flip-flop circuit receives a set/reset signal externally or from any one of said plurality of combination circuits, and an output of said second latch means of each flip-flop circuit is also supplied to any one of said plurality of combination circuits.

13. The semiconductor integrated circuit device according to claim 12, further comprising a fifth input terminal for receiving a control signal externally, wherein each of said plurality of flip-flop circuits further comprises a control terminal connected to said fifth input terminal, and said control means of each of said plurality of flip-flop circuits apply said diagnosis clock signal to said first latch means when said control signal is in a first state, and apply said set/reset signal to said first latch means when said control signal is in a second state, in diagnostic operation.

14. A method of operating a flip-flop circuit including first and second latch means connected serially, and having a set/reset function, comprising the steps of:

sequentially holding and providing main data by said first and second latch means in response to a main clock signal, or setting/resetting said first and second latch means in response to a set/reset signal during normal operation;

holding and providing main data by said first latch means in response to a diagnosis clock signal, or setting/resetting the first latch means in response to a set/reset signal, and having the second latch means maintain a data holding state during diagnostic operation; and holding and providing a diagnosis data by said first latch means in response to a first shift operation clock signal, and holding and providing the output signal of the first latch means by the second latch means during shift operation.

15. A method of operating a flip-flop circuit including first and second latch means connected serially, and having a set/reset function, comprising the steps of:

controlling said first and second latch means so as to sequentially hold and provide main data in response to a main clock signal, or setting/resetting said first and second latch means in response to a set/reset signal during normal operation;

controlling said first latch means so as to hold and output main data in response to a diagnosis clock signal or setting/resetting said first latch means in response to a set/reset signal, and controlling said second latch means so as to maintaining a data holding state during diagnostic operation; and controlling said first latch means so as to hold and output diagnosis data in response to a first shift operation clock signal, and controlling said second latch means so as to hold and output an output signal of said first latch means in response to a second shift operation clock signal during shift operation.

16. The method according to claim 15, wherein
the step in said diagnostic operation comprises controlling said first latch means so as to holding and providing main data in response to a diagnosis clock signal when a control signal is in a first state, and setting/resetting said first latch means in response to a set/reset signal when the control signal is in a second state.

* * * * *